(12) United States Patent
Ogata et al.

(10) Patent No.: US 6,633,077 B2
(45) Date of Patent: Oct. 14, 2003

(54) SEMICONDUCTOR DEVICE AND METHOD FOR MANUFACTURING THE SAME

(75) Inventors: Shuichi Ogata, Osaka (JP); Kenichi Itoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/736,971

(22) Filed: Dec. 14, 2000

(65) Prior Publication Data

US 2001/0015482 A1 Aug. 23, 2001

(30) Foreign Application Priority Data

Dec. 15, 1999 (JP) .............................. 11-356446

(51) Int. Cl.$^7$ ............................................. H01L 23/495
(52) U.S. Cl. ...................................... 257/676; 257/666
(58) Field of Search ................................. 257/676, 666, 257/787

(56) References Cited

U.S. PATENT DOCUMENTS

| | | | |
|---|---|---|---|
| 5,214,307 A | * | 5/1993 | Davis |
| 5,397,915 A | * | 3/1995 | Nose |
| 5,512,781 A | * | 4/1996 | Inoue |
| 5,578,871 A | * | 11/1996 | Fierkens |
| 5,770,888 A | * | 6/1998 | Song et al. |
| 5,847,446 A | * | 12/1998 | Park et al. |
| 5,969,411 A | * | 10/1999 | Fukaya |
| 6,072,230 A | * | 6/2000 | Carter, Jr. et al. |
| 6,075,284 A | * | 6/2000 | Choi et al. |
| 6,229,205 B1 | * | 5/2001 | Jeong et al. |
| 6,246,110 B1 | * | 6/2001 | Kinsman et al. |
| 6,297,543 B1 | * | 10/2001 | Hong et al. |
| 6,303,985 B1 | * | 10/2001 | Larson et al. |

\* cited by examiner

*Primary Examiner*—Sheila V. Clark
(74) *Attorney, Agent, or Firm*—Merchant & Gould, P.C.

(57) ABSTRACT

On a surface of a pair of support leads formed in one piece with a die pad on which a semiconductor chip is mounted, a protrusion is formed on the side that the semiconductor chip is mounted. During a resin-sealing, a lower surface of the die pad is brought into contact with an internal wall surface of a lower die, while a top of the protrusion is brought into contact with an internal wall surface of an upper die. This makes it possible to prevent the displacement of the die pad during sealing, thus causing no residual distortion of the semiconductor chip. As a result, a semiconductor device with a stable quality can be obtained.

13 Claims, 16 Drawing Sheets

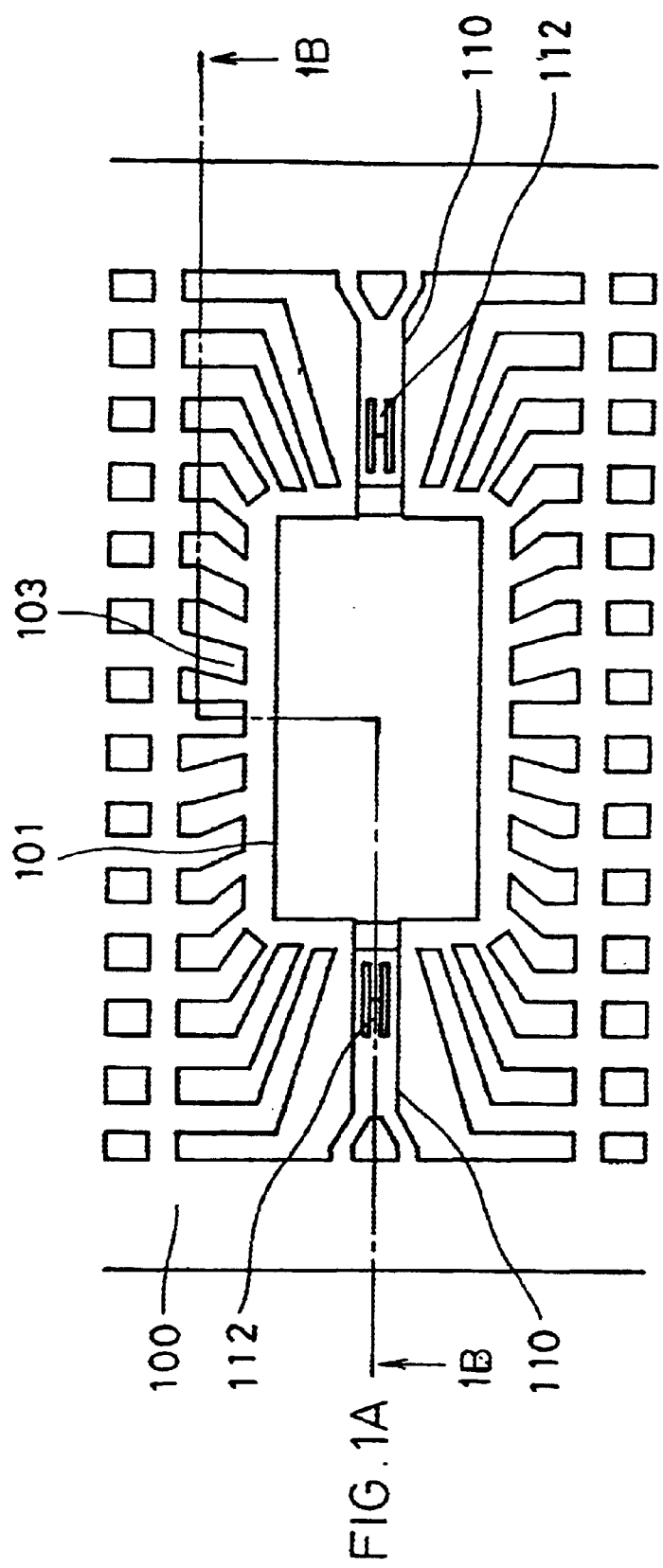
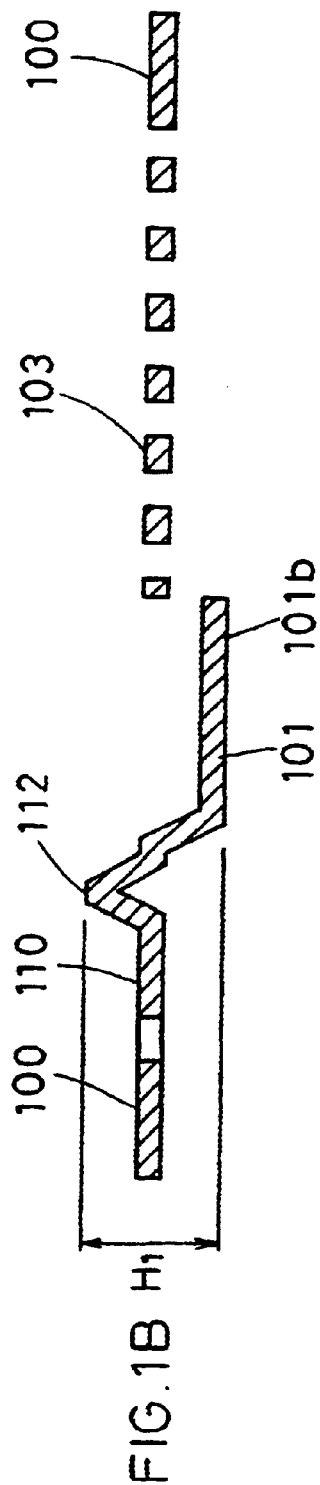
FIG. 1A
FIG. 1B

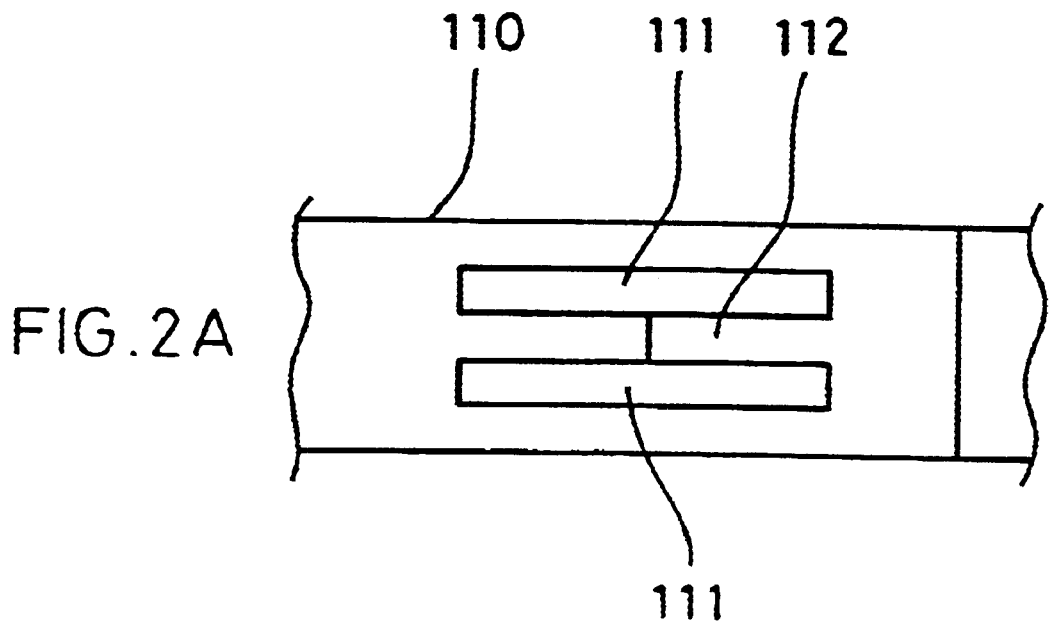
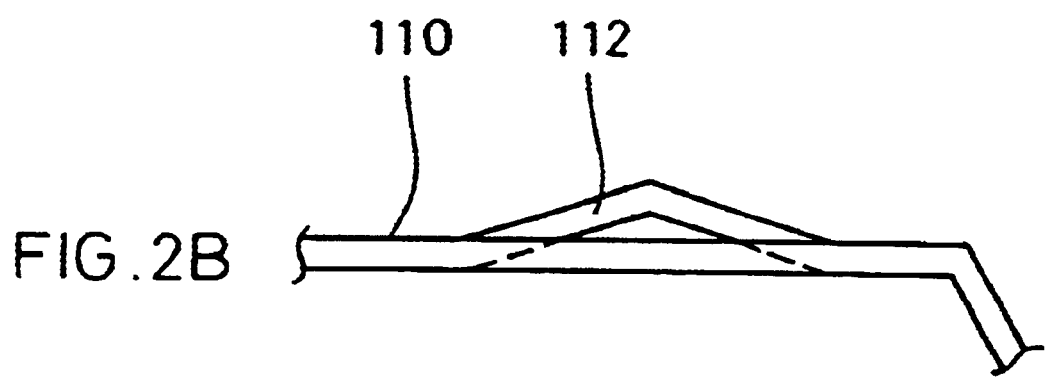

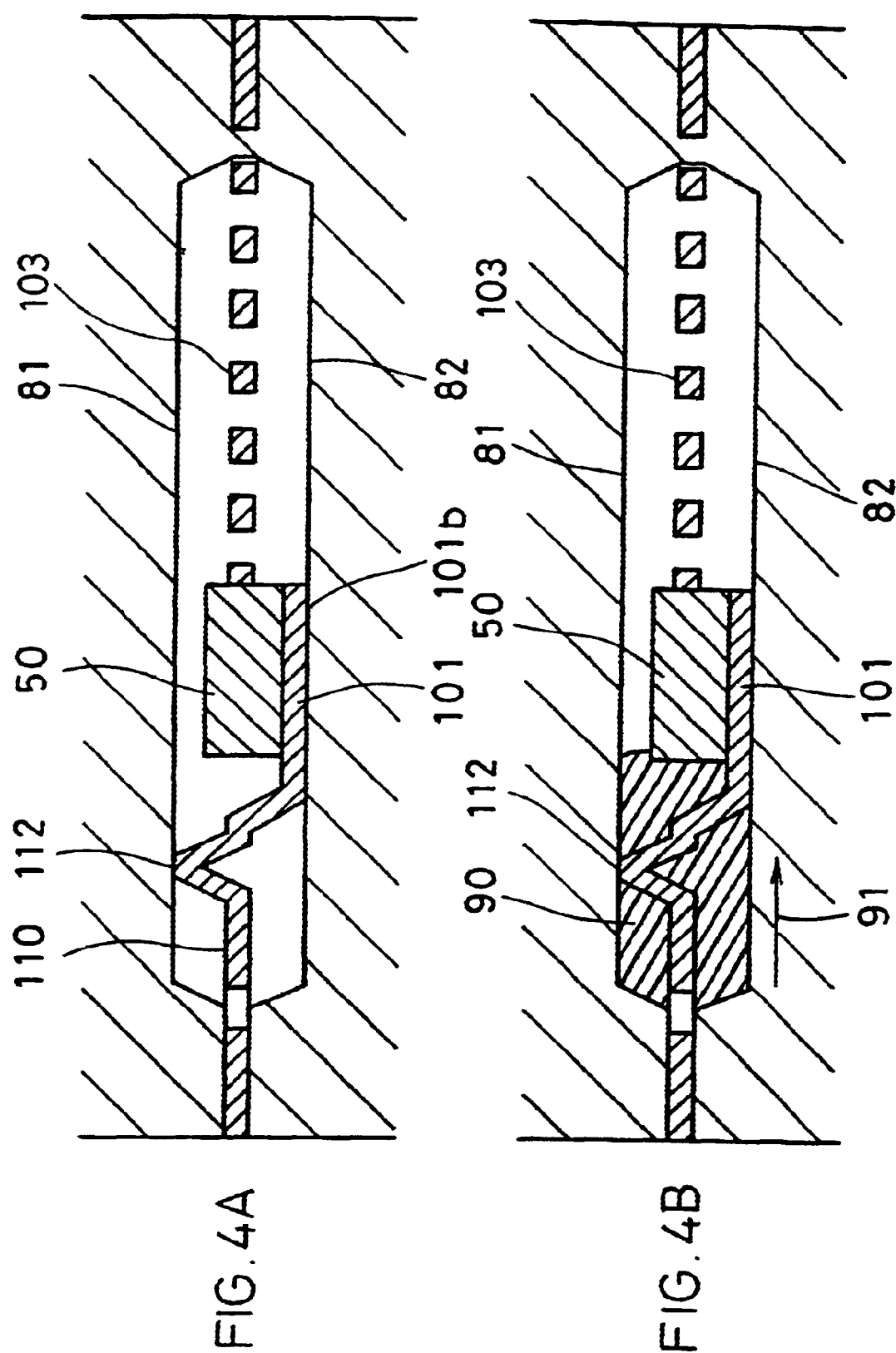

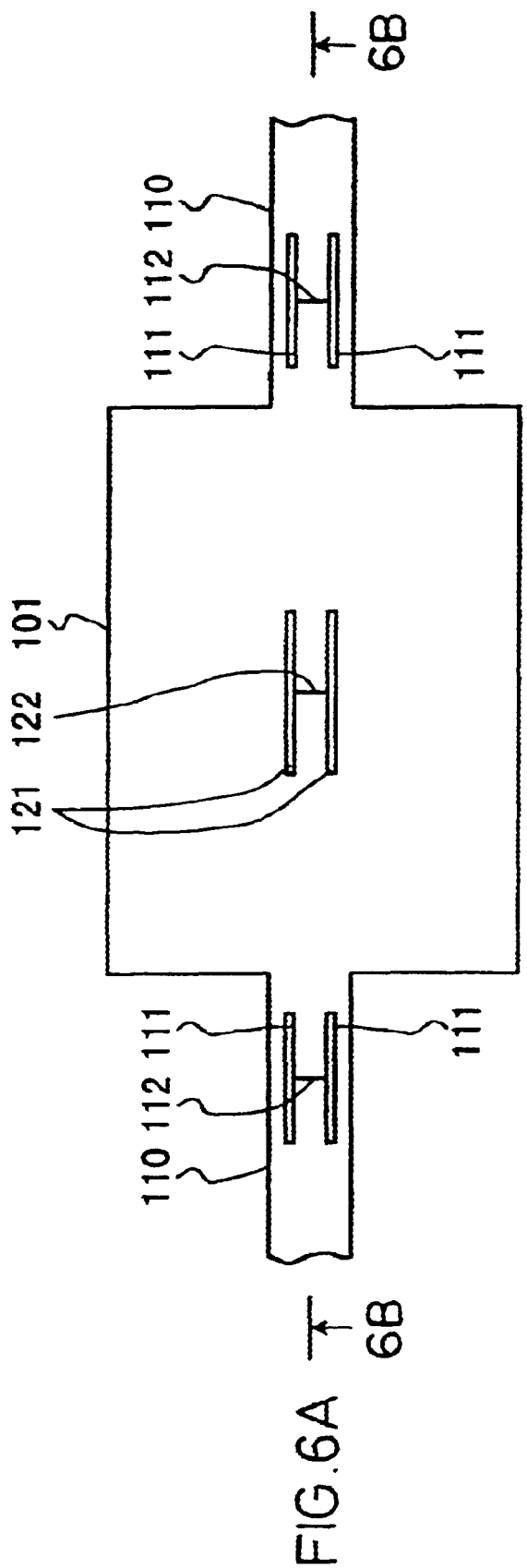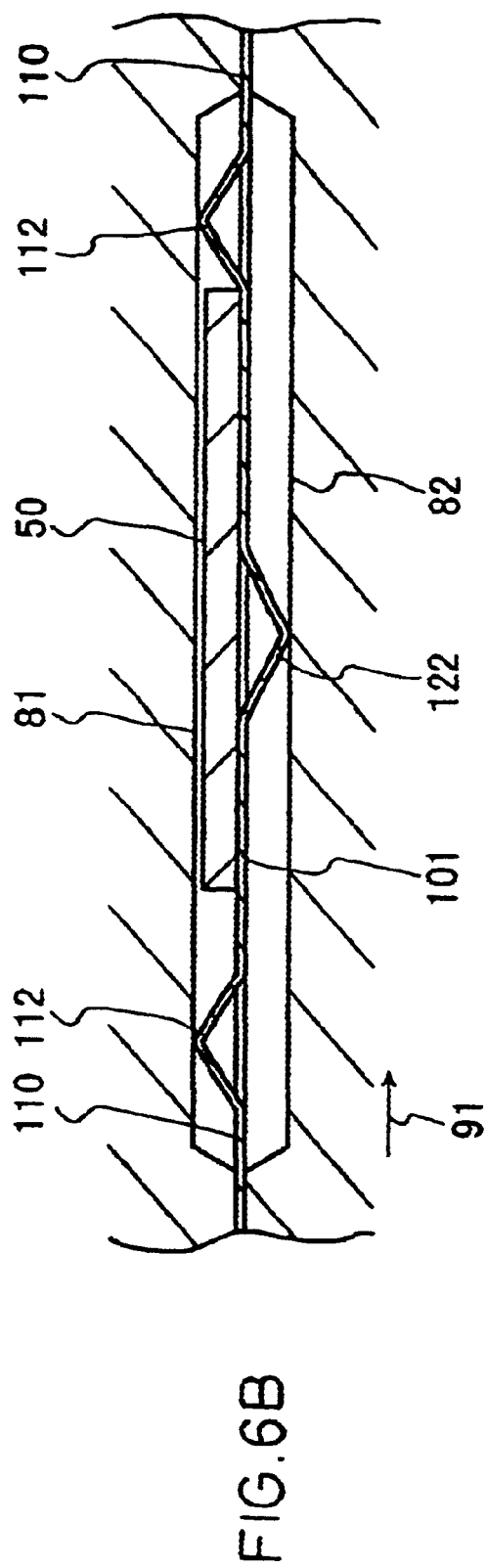
FIG.6A
FIG.6B

FIG.7A
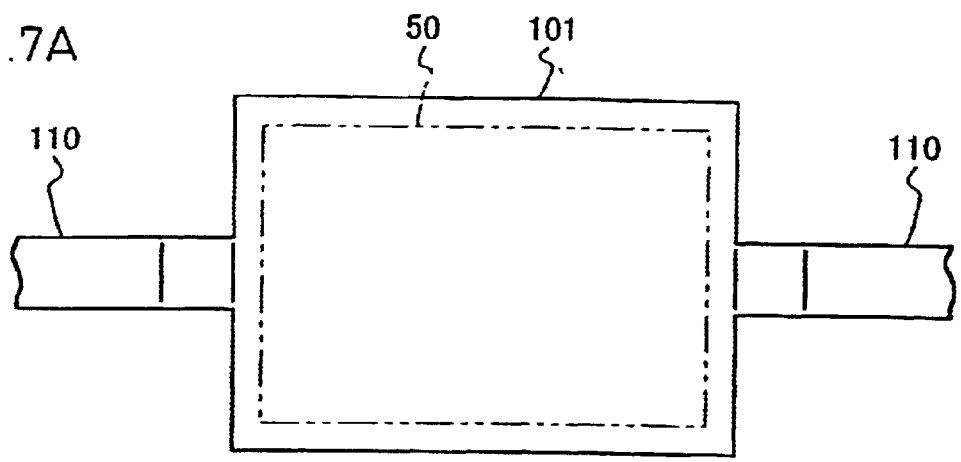
FIG.7B
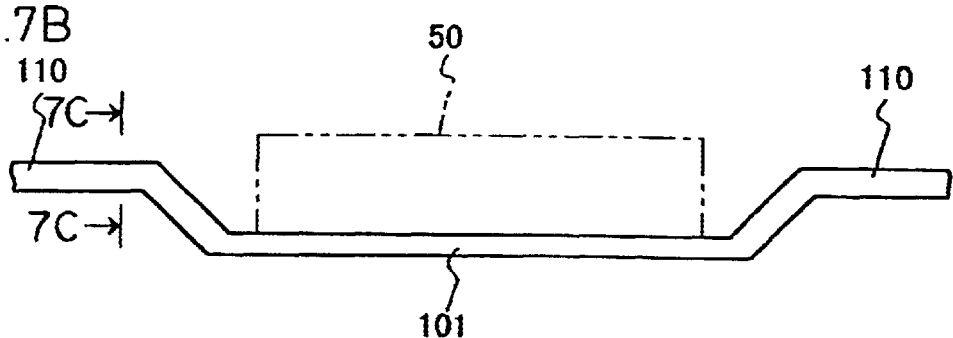
FIG.7C
FIG.7D

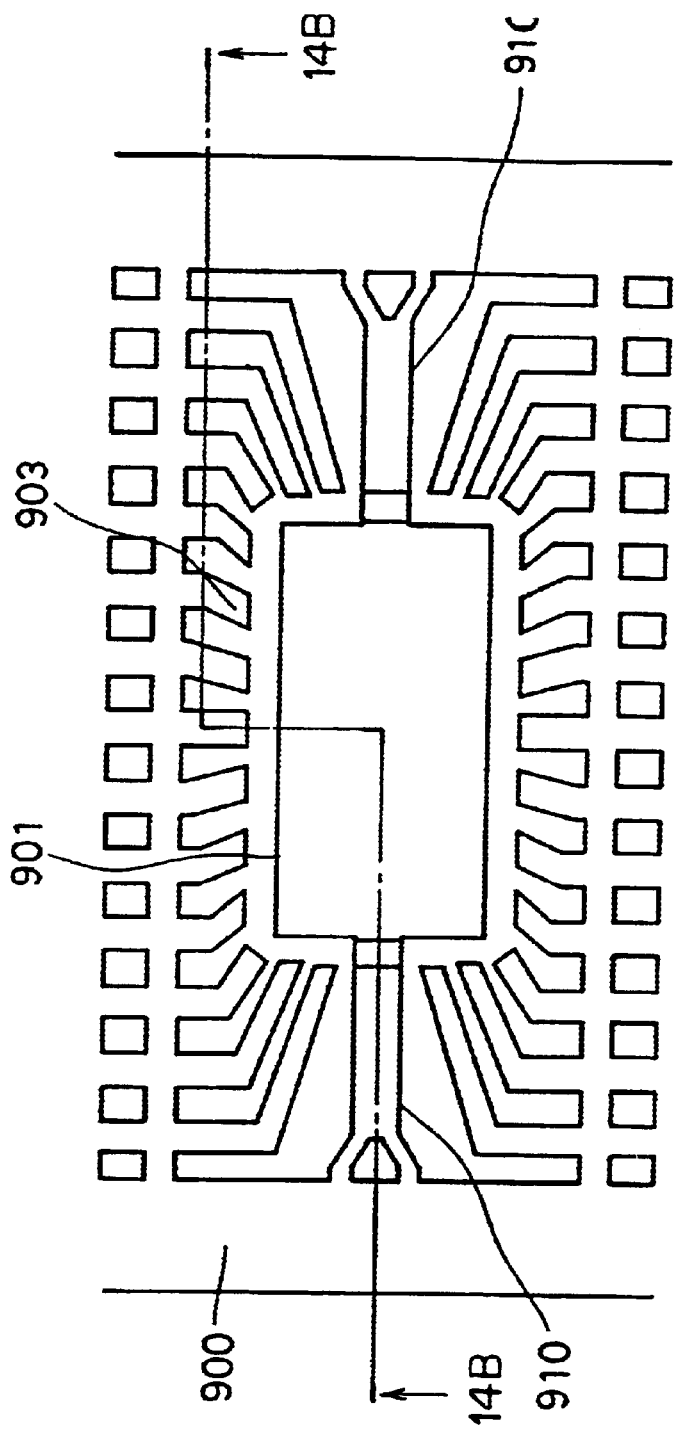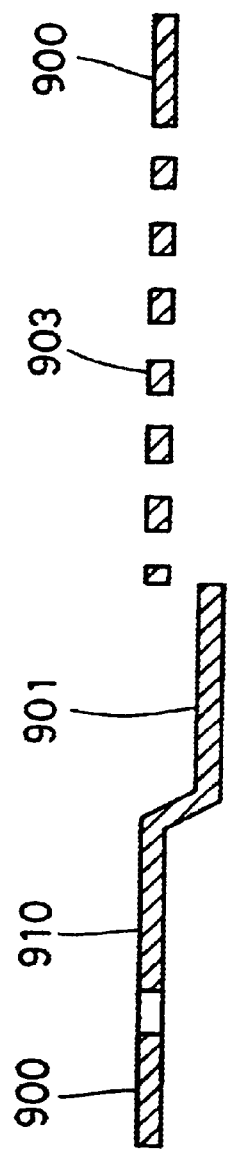
FIG. 14A PRIOR ART
FIG. 14B PRIOR ART

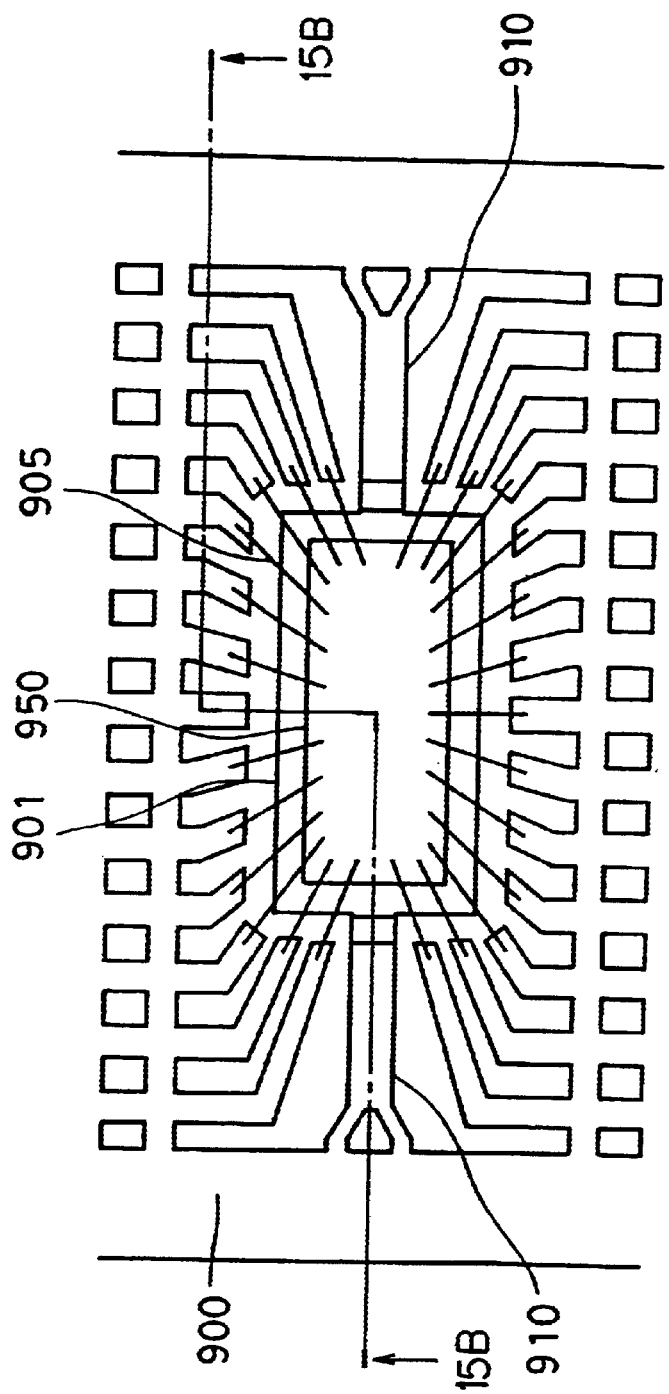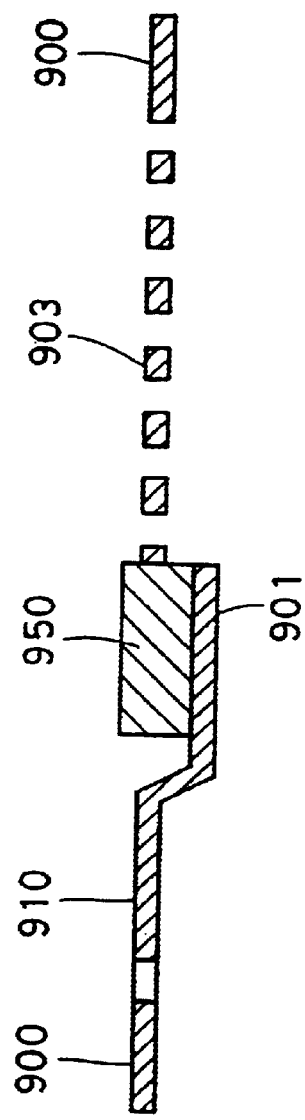
FIG. 15A PRIOR ART
FIG. 15B PRIOR ART

SEMICONDUCTOR DEVICE AND METHOD FOR MANUFACTURING THE SAME

BACKGROUND OF THE INVENTION

1. Field of the Invention

The present invention relates to a resin-sealed semiconductor device for surface mounting and a method for manufacturing the same.

2. Description of the Related Art

The following is a description of a general method for manufacturing a resin-sealed semiconductor device, with reference to the accompanying drawings.

First, a metal sheet is processed into a desired shape of electrodes by etching or press working, thus producing a lead frame. FIGS. 14A and 14B show an example of the obtained lead frame, with FIG. 14A being a plan view and FIG. 14B showing a combinational cross-section taken stepwise along the alternate long and short dash line A—A in FIG. 14A seen in an arrow direction. In FIGS. 14A and 14B, numeral 900 denotes a frame, numeral 901 denotes a die pad on which a semiconductor chip is mounted, numeral 903 denotes bonding leads for a connection to the semiconductor chip, and numeral 910 denotes a pair of support leads for supporting the die pad 901 from both sides. As shown in the figure, the die pad 901 is displaced toward the side opposite to that on which the semiconductor chip is mounted with respect to a plane including the frame 900 and the bonding leads 903, so as to be depressed stepwise.

Next, as shown in FIGS. 15A and 15B, a semiconductor chip 950 is mounted on and bonded to the die pad 901 with an adhesive or the like. Then, a bonding pad of the semiconductor chip 950 and the bonding leads 903 are connected by wires 905 (wire-bonded). FIG. 15A is a plan view, and FIG. 15B shows a combinational cross-section taken stepwise along the alternate long and short dash line A—A in FIG. 15A seen in an arrow direction.

Subsequently, as shown in FIG. 16A, the semiconductor chip 950, the die pad 901 and the bonding leads 903 are sealed between an upper die 981 and a lower die 982. As shown in FIG. 16B, a sealing resin 990 is injected in an injection direction 991 to form a resin-seal, then the dies 981 and 982 are opened to obtain a semiconductor device. FIGS. 16A and 16B show combinational cross-sections taken stepwise along a line corresponding to the alternate long and short dash line A—A in FIGS. 14A and 15A seen in an arrow direction.

Semiconductor devices are required to have still higher performance, smaller size, thinner structure and more pins. For achieving higher performance, current-driven bipolar semiconductor chips, for example, come to be used widely. Since the semiconductor chips of this type generate a large amount of heat, they need to be designed considering their heat radiation. For this purpose, as shown in FIG. 16A, the die pad 901 is depressed with respect to the frame 900 such that the lower surface of the die pad 901 contacts an internal wall surface of the lower die 982. In this manner, after the resin-sealing, the lower surface of the die pad 901 is exposed to the lower surface of the semiconductor device. By packaging the semiconductor device so that this surface contacts closely to a circuit board, the heat generated by the semiconductor chip 950 can be conducted to the circuit board via the die pad 901 so as to be radiated.

For reducing the size and thickness of the semiconductor device and increasing the number of pins therein, it is desired that a metal sheet with which a lead frame is produced is made thinner and that the support lead 910 for supporting the die pad 901 is made narrower. However, this reduces the strength of the support lead 910. Consequently, as shown in FIG. 16B, when the resin is injected, the die pad 901 floats up due to a resin flow and a press shape of the support lead 910, so that the resin is injected also at the lower surface of the die pad 901. As a result, the lower surface of the die pad 901 cannot be exposed to the lower surface of the semiconductor device, making it impossible to radiate heat sufficiently from the semiconductor chip 950.

In addition, when the die pad 901 is displaced during the resin-sealing as described above, the semiconductor chip 950 mounted on the die pad 901 is somewhat distorted. Thus, if the die pad 901 is sealed while keeping the displacement, the semiconductor chip 950 maintains its distortion so that internal stress remains. This causes a change in the resistance of wiring in the semiconductor chip, leading to variations in characteristics. This also is a problem in those semiconductor devices in which the die pad 901 is not exposed to the lower surface of the semiconductor device because the heat-radiating characteristics are not as important.

SUMMARY OF THE INVENTION

Thus, it is an object of the present invention to prevent displacement of a die pad during a resin-sealing and residual distortion in a semiconductor chip, thereby providing a semiconductor device with a stable quality and the method for manufacturing the same.

In order to achieve the above-mentioned object, the present invention has the following structure.

A semiconductor device according to a first structure of the present invention includes a semiconductor chip, a die pad having a surface on which the semiconductor chip is mounted, and support leads formed in one piece with the die pad. The semiconductor chip, the die pad and the support leads are sealed with a resin. Protrusions are formed on the support leads on a same side as that of the die pad on which the semiconductor chip is mounted. With this structure, the protrusions provided in the support leads prevent the displacement of the die pad during the resin-sealing. Therefore, the die pad is arranged according to its initial design, making it possible to obtain the semiconductor device having the semiconductor chip in which distortion does not remain.

In the first semiconductor device described above, a second protrusion may be formed on a surface of the die pad opposite to that on which the semiconductor chip is mounted. With this structure, the protrusions (first protrusions) provided in the support leads and the second protrusion provided in the die pad can prevent the displacement of the die pad during the resin-sealing.

Also, in the first semiconductor device described above, it is preferable that tops of the first and second protrusions are formed close to a resin surface of the semiconductor device. It is especially preferable that the tops of the first and second protrusions are exposed to an outer surface of the semiconductor device. With this structure, these tops contact internal wall surfaces of dies for resin-sealing, thereby preventing the displacement of the die pad during the resin-sealing.

In addition, in the first semiconductor device described above, it is preferable that a surface of the die pad opposite to that on which the semiconductor chip is mounted is arranged close to a resin surface of the semiconductor device. It is especially preferable that that the surface of the die pad opposite to that on which the semiconductor chip is mounted is exposed to an outer surface of the semiconductor device. With this structure, heat generated by the semiconductor chip can be radiated easily via the die pad.

A method for manufacturing the semiconductor device according to a first structure of the present invention includes forming a die pad and support leads as one piece using a flat metal plate, as well as forming protrusions on a surface of the support leads, mounting a semiconductor chip on a surface of the die pad opposite to that on which the protrusions are formed, and enclosing the die pad, the support leads and the semiconductor chip in a die, so as to seal them with a resin while bringing the protrusions into contact with an internal wall surface of the die. With this structure, the protrusions provided in the support leads prevent the displacement of the die pad during the resin-sealing. Therefore, the die pad is arranged according to its initial design, making it possible to obtain the semiconductor device having the semiconductor chip in which distortion does not remain.

In the first method for manufacturing the semiconductor device described above, the resin-sealing can be performed while bringing a surface of the die pad opposite to that on which the semiconductor chip has been mounted into contact with an internal wall surface of the die. With this structure, it is possible to prevent the displacement of the die pad during the resin-sealing, so the distortion does not remain in the semiconductor chip. Also, the lower surface of the die pad can be exposed to the lower surface of the semiconductor device, thus obtaining a semiconductor device with excellent heat-radiating characteristics.

In the first method for manufacturing the semiconductor device described above, a second protrusion may be formed on a surface of the die pad opposite to that on which the semiconductor chip has been mounted, and the resin-sealing may be performed while bringing the second protrusion into contact with an internal wall surface of the die. With this structure, the protrusions (first protrusions) provided in the support leads and the second protrusion provided in the die pad can prevent the displacement of the die pad during the resin-sealing.

A semiconductor device according to a second structure of the present invention includes a semiconductor chip, a die pad having a surface on which the semiconductor chip is mounted, and support leads formed in one piece with the die pad. The semiconductor chip, the die pad and the support leads are sealed with a resin. The support leads are curved or bent in parallel to their longitudinal directions. With this structure, the bending strength of the support leads improves, thereby preventing the displacement of the die pad during the resin-sealing. Therefore, the die pad is arranged according to its initial design, making it possible to obtain the semiconductor device having the semiconductor chip in which distortion does not remain.

A semiconductor device according to a third structure of the present invention includes a semiconductor chip, a die pad having a surface on which the semiconductor chip is mounted, and support leads formed in one piece with the die pad. The semiconductor chip, the die pad and the support leads are sealed with a resin. A recess is formed on a periphery of a surface of the die pad opposite to the surface on which the semiconductor chip is mounted, and the surface opposite to that on which the semiconductor chip is mounted is arranged close to a resin surface of the semiconductor device. It is especially preferable that the surface of the die pad opposite to that on which the semiconductor chip is mounted is exposed to an outer surface of the semiconductor device. With this structure, it is possible to prevent the displacement of the die pad during the resin-sealing, so the distortion does not remain in the semiconductor chip. Also, it is possible to obtain a semiconductor device with excellent heat-radiating characteristics.

A method for manufacturing the semiconductor device according to a second structure of the present invention includes forming a die pad and support leads as one piece using a flat metal plate, forming a recess on a periphery of the die pad, mounting a semiconductor chip on a surface of the die pad opposite to that on which the recess is formed, and enclosing the die pad, the support leads and the semiconductor chip in a die, so as to seal them with a resin while bringing the surface of the die pad on which the recess has been formed into contact with an internal wall surface of the die. With this structure, it is possible to prevent the displacement of the die pad during the resin-sealing, so the distortion does not remain in the semiconductor chip. Also, the lower surface of the die pad can be exposed to the lower surface of the semiconductor device, thus obtaining the semiconductor device with excellent heat-radiating characteristics.

A semiconductor device according to a fourth structure of the present invention includes a semiconductor chip, a die pad having a surface on which the semiconductor chip is mounted, and support leads formed in one piece with the die pad. The semiconductor chip, the die pad and the support leads are sealed with a resin. A periphery of a surface of the die pad opposite to the surface on which the semiconductor chip is mounted is formed to protrude, and the protruding periphery is arranged close to a resin surface of the semiconductor device. It is especially preferable that the protruding periphery is exposed to an outer surface of the semiconductor device. With this structure, it is possible to prevent the displacement of the die pad during the resin-sealing, so the distortion does not remain in the semiconductor chip. Also, it is possible to obtain the semiconductor device with excellent heat-radiating characteristics.

A method for manufacturing the semiconductor device according to a third structure of the present invention includes forming a die pad and support leads as one piece using a flat metal plate, forming a protrusion on a periphery of the die pad, mounting a semiconductor chip on a surface of the die pad opposite to that on which the protrusion has been formed, and enclosing the die pad, the support leads and the semiconductor chip in a die, so as to seal them with a resin while bringing the protrusion of the die pad into contact with an internal wall surface of the die. With this structure, it is possible to prevent the displacement of the die pad during the resin-sealing, so the distortion does not remain in the semiconductor chip. Also, the protrusion of the die pad can be exposed to the lower surface of the semiconductor device, thus obtaining the semiconductor device with excellent heat-radiating characteristics.

A method for manufacturing the semiconductor device according to a fourth structure of the present invention includes forming a die pad and support leads as one piece using a flat metal plate, forming a recess on a periphery of the die pad, mounting a semiconductor chip on a surface of the die pad opposite to that on which the recess has been formed, and enclosing the die pad, the support leads and the semiconductor chip in a die, so as to seal them with a resin. A protrusion is formed on an internal wall surface of the die so as to face the recess, and the resin-sealing is performed while bringing the recess and the protrusion into contact with each other. With this structure, it is possible to prevent the displacement of the die pad during the resin-sealing, so the distortion does not remain in the semiconductor chip.

Also, the lower surface of the die pad can be exposed to the lower surface of the semiconductor device, thus obtaining the semiconductor device with excellent heat-radiating characteristics.

In the fourth method for manufacturing the semiconductor device described above, it is preferable that spaces are formed between the recess and the die on outer and inner sides of the protrusion. With this structure, it is possible to prevent the displacement of the die pad during the resin-sealing in a more reliable manner.

In the fourth method for manufacturing the semiconductor device described above, it is preferable that a groove-like concavity is formed next to the protrusion on an inner side of the protrusion of the die. With this structure, it is possible to prevent the displacement and the deformation of the die pad during the resin-sealing in a more reliable manner. Also, it is possible to ease the machining accuracy of the recess of the die pad and the protrusion of the die.

A method for manufacturing the semiconductor device according to a fifth structure of the present invention includes forming a die pad and support leads as one piece using a flat metal plate, mounting a semiconductor chip on a surface of the die pad, and enclosing the die pad, the support leads and the semiconductor chip in a die, so as to seal them with a resin while sticking a surface of the die pad opposite to that on which the semiconductor chip has been mounted to an internal wall surface of the die. With this structure, it is possible to prevent the displacement of the die pad during the resin-sealing, so the distortion does not remain in the semiconductor chip. Also, the lower surface of the die pad can be exposed to the lower surface of the semiconductor device, thus obtaining the semiconductor device with excellent heat-radiating characteristics.

In the first to fourth semiconductor devices described above, the die pad may be displaced toward an opposite side of the surface on which the semiconductor chip is mounted with respect to the support leads. Also, in the first to fifth methods for manufacturing the semiconductor device described above, the die pad may be formed so as to be displaced toward an opposite side of the surface on which the semiconductor chip is mounted with respect to the support leads. With these structures, the surface of the die pad opposite to that on which the semiconductor chip is mounted can be arranged close to the resin surface of the semiconductor device more easily.

BRIEF DESCRIPTION OF THE DRAWINGS

FIGS. 1A and 1B illustrate one manufacturing step of a semiconductor device of a first embodiment of the present invention, with FIG. 1A being a plan view and FIG. 1B showing a combinational cross-section taken stepwise along the alternate long and short dash line A—A in FIG. 1A seen in an arrow direction.

FIGS. 2A and 2B illustrate a structure of a protrusion formed in a support lead, with FIG. 2A being a partial enlarged plan view and FIG. 2B being a partial enlarged side view.

FIGS. 4A and 4B show combinational cross-sections illustrating manufacturing steps of the semiconductor device of the first embodiment of the present invention.

FIGS. 6A and 6B are figures for describing a manufacturing step of a semiconductor device of a second embodiment of the present invention, with FIG. 6A being a plan view illustrating a shape of a lead frame and FIG. 6B being a sectional view illustrating a state of sealing with upper and lower dies.

FIGS. 7A to 7D illustrate shapes of a lead frame used in a semiconductor device of a third embodiment of the present invention, with FIG. 7A being a plan view, FIG. 7B being a side view, FIG. 7C being a sectional view taken along the line B—B in FIG. 7B and FIG. 7D being a sectional view showing another structural example.

FIGS. 14A and 14B illustrate one manufacturing step of a conventional semiconductor device, with FIG. 14A being a plan view and FIG. 14B showing a combinational cross-section taken stepwise along the alternate long and short dash line A—A in FIG. 14A seen in an arrow direction.

FIGS. 15A and 15B illustrate one manufacturing step of the conventional semiconductor device, with FIG. 15A being a plan view and FIG. 15B showing a combinational cross-section taken stepwise along the alternate long and short dash line A—A in FIG. 15A seen in an arrow direction.

DESCRIPTION OF THE PREFERRED EMBODIMENTS

Figure 3A:
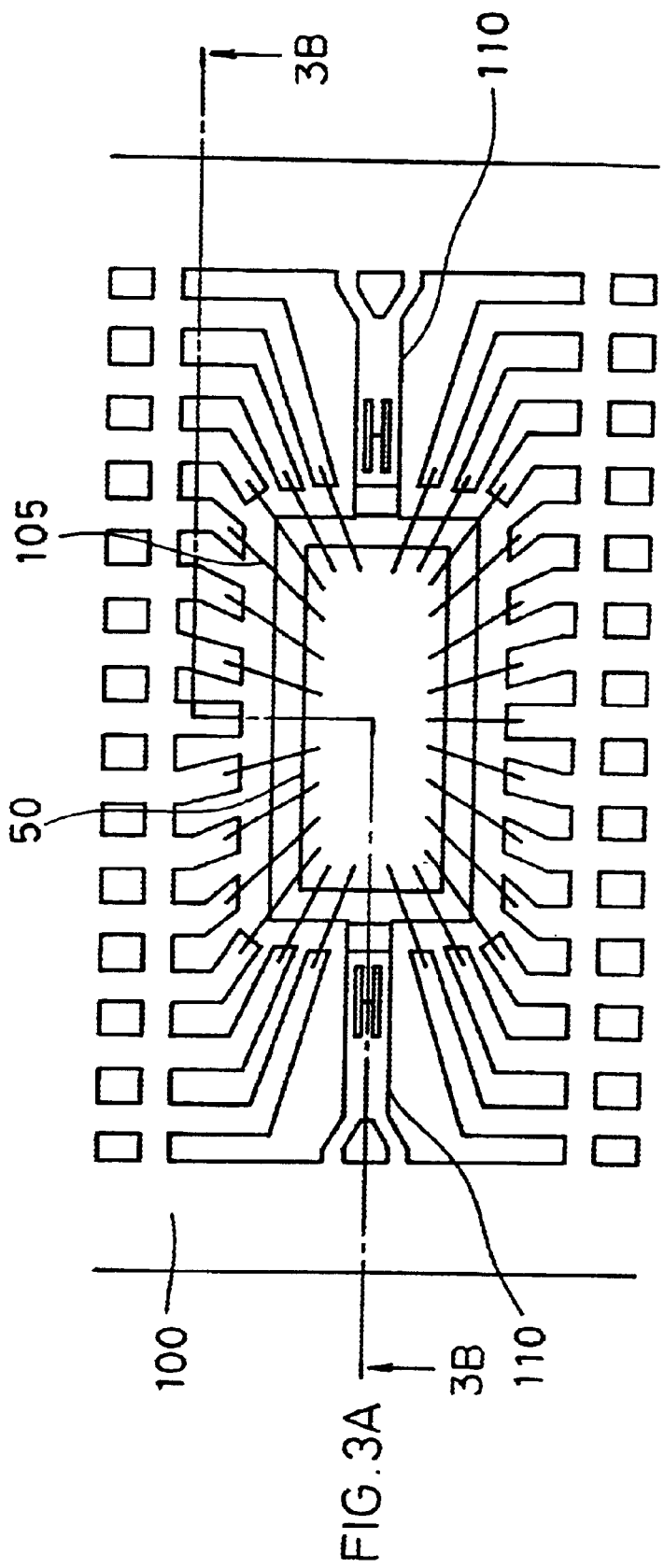
FIGS. 3A and 3B illustrate one manufacturing step of the semiconductor device of the first embodiment of the present invention, with FIG. 3A being a plan view and FIG. 3B showing a combinational cross-section taken stepwise along the alternate long and short dash line A—A in FIG. 3A seen in an arrow direction.

The following is a description of embodiments of the present invention, with reference to the accompanying drawings.

First Embodiment

A semiconductor device of a first embodiment of the present invention will be described, with reference to the accompanying drawings.

First, a metal sheet is processed into a desired shape of electrodes by etching or press working, thus producing a lead frame. FIGS. 1A and 1B show an example of the obtained lead frame, with FIG. 1A being a plan view and FIG. 1B showing a combinational cross-section taken stepwise along the alternate long and short dash line A—A in FIG. 1A seen in an arrow direction. In FIGS. 1A and 1B, numeral 100 denotes a frame, numeral 101 denotes a die pad on which a semiconductor chip is mounted, numeral 103 denotes bonding leads for a connection to the semiconductor chip, and numeral 110 denotes a pair of support leads for supporting the die pad 101 from both sides. As shown in the figure, the die pad 101 is displaced toward the side opposite to that on which the semiconductor chip is mounted with respect to a plane including the frame 100 and the bonding leads 103, so as to be depressed stepwise. In the present embodiment, protrusions 112 are formed on the pair of support leads 110 toward a direction opposite to that in which the die pad 101 is depressed (upward in FIG. 1B, on the side that the semiconductor chip is mounted).

FIGS. 2A and 2B show a specific structure of the protrusion 112 in the support lead 110. FIG. 2A is a partial enlarged plan view, and FIG. 2B is a partial enlarged side view. In FIGS. 2A and 2B, although not shown in the figures, the die pad 101 is connected on the right side of the support lead 110. As shown in the figures, a pair of openings 111 are provided substantially in parallel to the longitudinal direction of the support lead 110, then a bridge-like portion between the pair of the openings 111 is deformed to protrude toward the side opposite to the direction the die pad 101 is depressed, thus forming the protrusion 112.

As shown in FIG. 1B, the height $H_1$ from the lower surface 101b of the die pad 101 to the upper end face of the protrusion 112 substantially is equivalent to the gap in the vertical direction between internal wall surfaces of an upper die 81 and a lower die 82, which are to be discussed in the following.

Figure 3B:
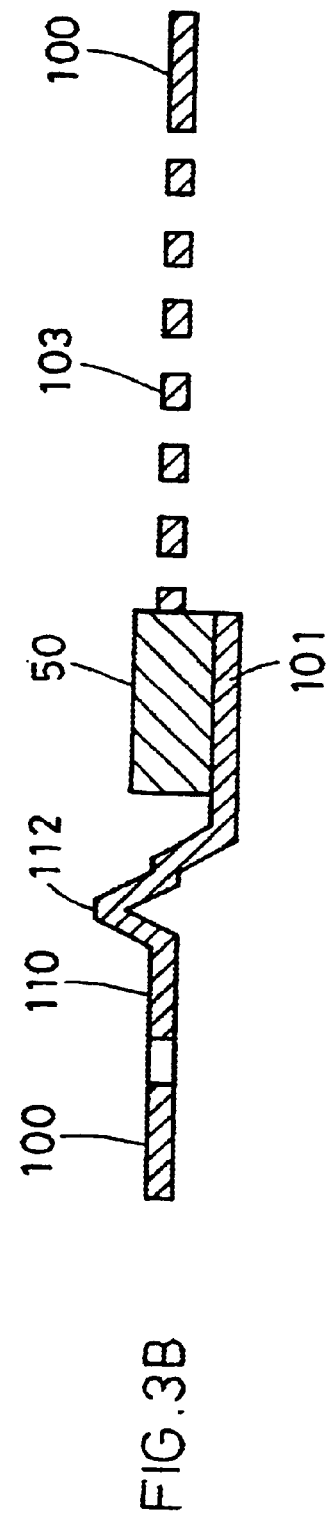

Next, as shown in FIGS. 3A and 3B, a semiconductor chip 50 is mounted on and bonded to the die pad 101 with an adhesive or the like. Then, a bonding pad of the semiconductor chip 50 and the bonding leads 103 are connected by wires 105 (wire-bonded). FIG. 3A is a plan view, and FIG. 3B shows a combinational cross-section taken stepwise along the alternate long and short dash line A—A in FIG. 3A seen in an arrow direction.

Subsequently, as shown in FIG. 4A, the semiconductor chip 50, the die pad 101 and the bonding leads 103 are sealed between the upper die 81 and the lower die 82. The upper end face of the protrusion 112 is in contact with the internal wall surface of the upper die 81, and the lower surface 101b of the die pad 101 is in contact with the internal wall surface of the lower die 82. Subsequently, as shown in FIG. 4B, a sealing resin 90 is injected in an injection direction 91 to form a resin-seal, and then the dies 81 and 82 are opened to obtain a semiconductor device. FIGS. 4A and 4B show combinational cross-sections taken stepwise along a line corresponding to the alternate long and short dash line A—A in FIGS. 1A and 3A seen in an arrow direction.

In accordance with the present embodiment, it is possible to prevent the die pad 101 from floating up during resin-sealing by means of the protrusions 112 provided in the support leads 110 on both sides of the die pad 101. Thus, a resin layer cannot be formed easily on the lower surface of the die pad 101, so that the lower surface 101b of the die pad 101 can be arranged close to a resin surface of the semiconductor device, preferably exposed to the lower surface of the semiconductor device. Also, since the resin is injected while the die pad 101 is being pressed against the wall surface of the lower die 82, the resin-sealing does not cause the distortion of the semiconductor chip 50 that is mounted on the die pad 101. Therefore, it is possible to obtain the semiconductor device with a stable quality.

In the present embodiment, the protrusions are not limited to the above structure, as long as they protrude toward the direction opposite to that in which the die pad 101 is depressed (the side on which the semiconductor chip 50 is mounted) and can contact the wall surface of the die facing that with which the lower surface 101b of the die pad 101 is in contact.

Figure 5A:
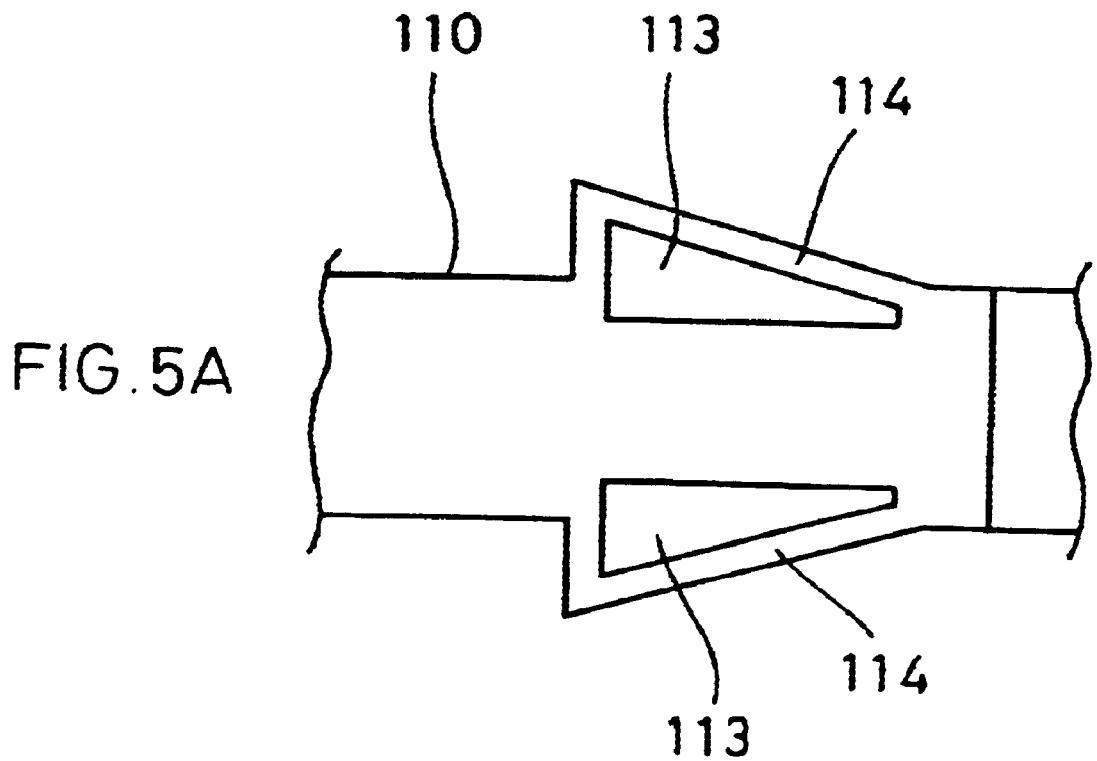
FIGS. 5A and 5B illustrate a protrusion having another structure in the support lead, with FIG. 5A being a partial enlarged plan view for describing a method for forming the protrusion and FIG. 5B being a partial enlarged side view illustrating a state after the protrusion is formed.
Figure 5B:
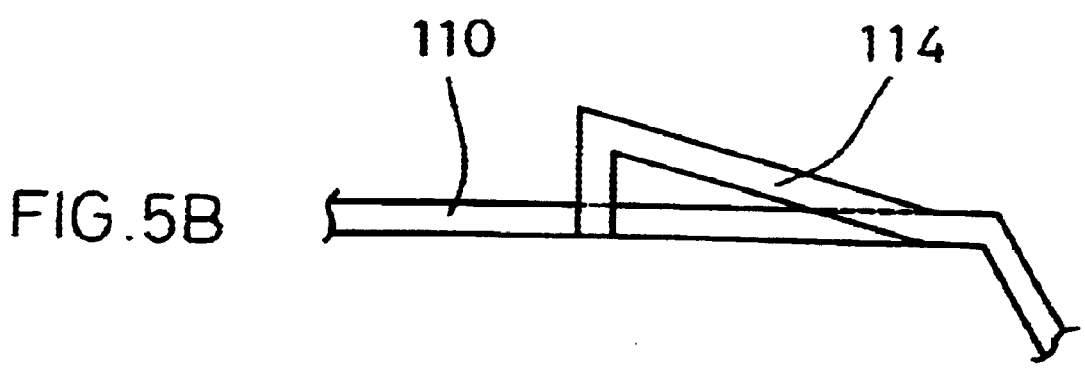

FIGS. 5A and 5B illustrate another embodiment of the protrusion. FIG. 5A is a partial enlarged plan view for describing a method for forming the protrusion, and FIG. 5B is a partial enlarged side view illustrating a state after the protrusion is formed. In FIGS. 5A and 5B, although not shown in the figures, the die pad 101 is connected on the right side of the support lead 110. First, as shown in FIG. 5A, both sides of the support lead 110 are formed into a wedge-shape so as to protrude toward outer sides, followed by forming two openings 113 in a width direction in the shape of a substantially right angled triangle having a side parallel to a slope of the wedge-shaped protrusion. Then, bridge-like portions 114 protruding toward outer sides are bent toward the direction opposite to that in which the die pad 101 is depressed, thus forming the protrusions 114 (see FIG. 5B). The protruding shape of the support lead 110 toward outer sides does not have to be the wedge-shape as shown in FIG. 5A, but may be a triangle, a circular arc or the like. The shape of the openings 113 also can be selected suitably according to this protruding shape. Alternatively, the protruding portions may be bent without forming the openings 113.

Second Embodiment

A semiconductor device of a second embodiment of the present invention will be described, with reference to the accompanying drawings.

FIG. 6A is a plan view illustrating a shape of a lead frame used in the semiconductor device of the present embodiment. In FIG. 6A, numeral 101 denotes a die pad on which a semiconductor chip is mounted, and numeral 110 denotes a pair of support leads for supporting the die pad 101 from both sides. In order to simplify the drawing, the frame and bonding leads are omitted here.

Also, FIG. 6B shows a cross-section illustrating a state when a semiconductor chip 50 is mounted on the die pad 101 shown in FIG. 6A, followed by sealing with an upper die 81 and a lower die 82, taken along a line corresponding to the line A—A in FIG. 6A seen in an arrow direction. Numeral 91 in this figure indicates an injection direction of a sealing resin.

The semiconductor device of the present embodiment is an example of semiconductor devices in which, since a semiconductor chip generates a relatively low amount of heat, heat-radiating characteristics are not required very much. Accordingly, the die pad 101 is not exposed to one surface of the semiconductor device. In this type of conventional semiconductor devices, there also has been a problem that the die pad 101 is displaced due to the injection of the sealing resin, causing a distortion of the mounted semiconductor chip 50.

However, the present embodiment prevents this problem by the following structure.

That is, in the present embodiment, protrusions (first protrusions) 112 that are similar to those described in FIGS. 2A and 2B of the first embodiment are formed on the pair of support leads 110 on the side that the semiconductor chip 50 is mounted. Furthermore, a second protrusion 122 protruding toward a direction opposite to the protrusions 112 is formed substantially in the center of the die pad 110. The method for forming the first protrusions 112 and the second protrusion 122 is basically the same as that for the protrusions 112 shown in FIGS. 2A and 2B. That is, a pair of openings 111 are provided substantially in parallel to the longitudinal direction of the support lead 110, and a pair of openings 121 also are provided substantially in parallel substantially in the center of the die pad 101. Then a bridge-like portion between the pair of the openings 111 provided in the support lead 110 is deformed to protrude toward the side that the semiconductor chip is mounted, thus forming the first protrusion 112, while a bridge-like portion between the pair of the openings 121 provided in the die pad 101 is deformed to protrude toward the side opposite to that on which the semiconductor chip is mounted, thus forming the second protrusion 122. The distance in the width direction (vertical direction in FIG. 6B) between the upper end face of the first protrusion 112 and the lower end face of the second protrusion 122 substantially is equivalent to the gap in the vertical direction between internal wall surfaces of an upper die 81 and a lower die 82. In addition, a top of the first protrusion 112 is located higher than the upper surface of the semiconductor chip 50.

In accordance with the present embodiment, when sealed with the dies 81 and 82, the second protrusion 122 provided in the die pad 101 contacts the internal wall surface of the lower die 82, while the first protrusions 112 provided in the support leads 110 on both sides of the die pad 101 contact the internal wall surface of the upper die 81, thereby restricting the displacement of the die pad 101 in the vertical direction. Thus, the die pad 101 is not displaced due to the resin injection, not causing the distortion of the semiconductor chip 50 that is mounted on the die pad 101. Therefore, it is possible to obtain the semiconductor device with a stable quality.

In the present embodiment, the first protrusions 112 and the second protrusion 122 are not limited to the above structure, as long as they protrude in the opposite directions to each other and the tops of these protrusions can contact the wall surfaces of the dies facing each other. For example, the protrusion shown in FIGS. 5A and 5B may be used as these protrusions. Also, the second protrusion to be provided in the die pad 101 is not limited to the position and number as shown in FIGS. 6A and 6B, but may have the structure in which, for example, the second protrusions are formed at four corners of the die pad 101 in addition to or instead of the second protrusion formed substantially in the center of the die pad 101 as shown in FIG. 6A.

Third Embodiment

A semiconductor device of a third embodiment of the present invention will be described, with reference to the accompanying drawings.

FIG. 7A is a plan view illustrating a shape of a lead frame used in the semiconductor device of the present embodiment. In FIG. 7A, numeral 101 denotes a die pad on which a semiconductor chip is mounted, and numeral 110 denotes a pair of support leads for supporting the die pad 101 from both sides. A double-dashed line 50 indicates the semiconductor chip to be mounted on the die pad 101. In order to simplify the drawing, the frame and bonding leads are omitted here.

FIG. 7B is a side view of the die pad 101 and the support leads 110 in FIG. 7A. FIG. 7C is a sectional view taken along the line B—B in FIG. 7B seen in an arrow direction.

The semiconductor device of the present embodiment is formed by curving the support lead 110 to have a cylindrical surface having a central axis parallel to its longitudinal direction as shown in FIG. 7C. Consequently, the bending strength of the support lead 110 improves, thus improving the stiffness in a normal line direction of the surface of the die pad 101 on which the chip is mounted. Therefore, it is possible to prevent the die pad 101 from floating up or being deformed during resin-sealing. Also, the distortion of the semiconductor chip 50 that is mounted on the die pad 101 is not caused due to a resin injection.

The cross-section of the support lead 110 is not limited to the shape shown in FIG. 7C, as long as it can improve the stiffness in the normal line direction of the surface of the die pad 101 on which the chip is mounted. For example, as shown in FIG. 7D, the support lead can be bent in parallel to its longitudinal direction at a predetermined angle so as to have a substantially V-shaped cross-section.

In the present embodiment, the lower surface of the die pad 101 may be or need not be exposed to the lower surface of the semiconductor chip. Also, the surface of the die pad 101 on which the chip is mounted need not be depressed with respect to a plane including the support leads 110 and the bonding leads 103 as in FIG. 7B.

Fourth Embodiment

A semiconductor device of a fourth embodiment of the present invention will be described, with reference to the accompanying drawings.

Figure 8A:
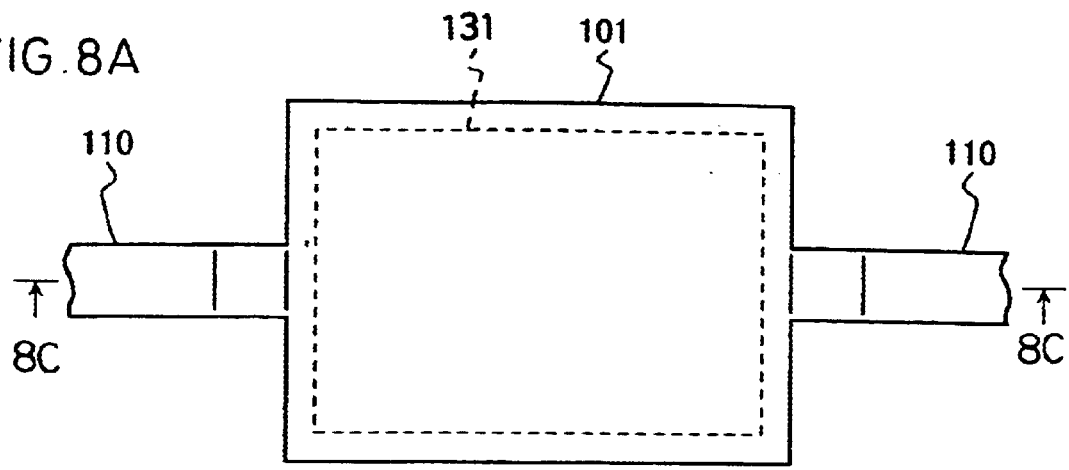
FIG. 8A is a plan view illustrating a shape of a lead frame used in a semiconductor device of a fourth embodiment of the present invention.
Figure 8B:
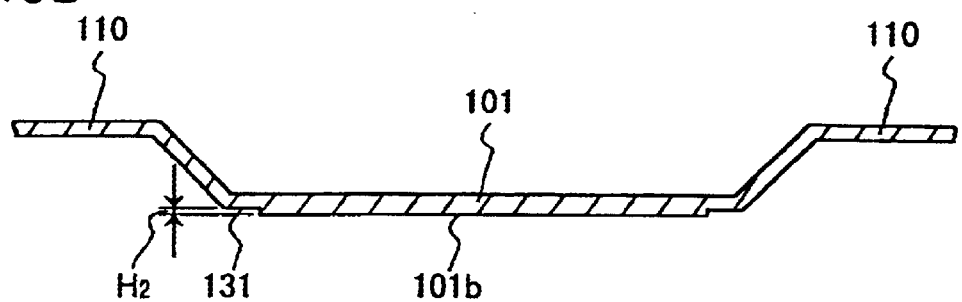
FIG. 8B is a sectional view taken along the line A—A in FIG. 8A.

FIG. 8A is a plan view illustrating a shape of a lead frame used in the semiconductor device of the present embodiment. In FIG. 8A, numeral 101 denotes a die pad on which a semiconductor chip is mounted, and numeral 110 denotes a pair of support leads for supporting the die pad 101 from both sides. The surface of the die pad 101 on which the chip is mounted is depressed with respect to the support leads 110. In order to simplify the drawing, the frame and bonding leads are omitted here. In addition, FIG. 8B is a sectional view taken along the line A—A in FIG. 8A seen in an arrow direction.

In the semiconductor device of the present embodiment, on the periphery of a surface 101b that is opposite to the surface of the die pad 101 on which the semiconductor chip is mounted, a recess 131 that is sunken stepwise with respect to the surface 101b is formed continuously.

Figure 8C:
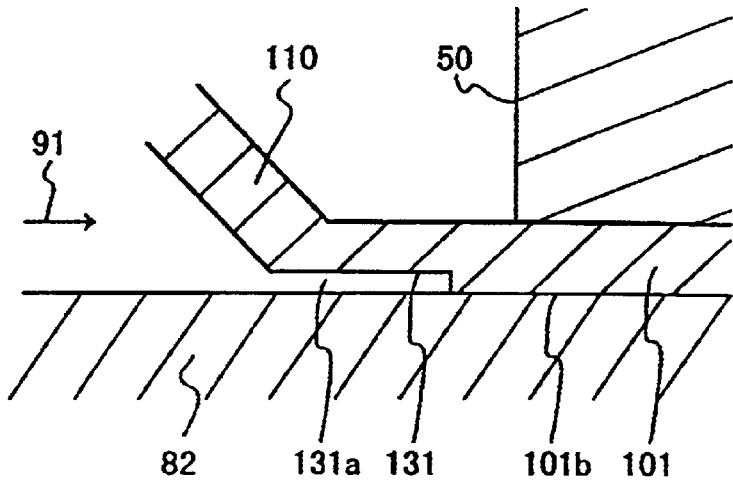
FIG. 8C is a partial enlarged sectional view illustrating a state of sealing with dies.

FIG. 8C is an enlarged sectional view illustrating a portion of the recess 131 taken along a line corresponding to the line A—A in FIG. 8A when a semiconductor chip 50 is mounted on the die pad 101, followed by sealing with dies. As shown in the figure, the die pad 101 is sealed in the dies so that its lower surface 101b contacts the wall surface of the lower die 82. Numeral 91 indicates an injection direction of a sealing resin.

In the present embodiment, since the recess 131 that is sunken with respect to the lower surface 101b is formed on the periphery of the lower surface of the die pad 101, when the sealing resin begins to be injected, the resin on the side of the lower surface of the support lead 110 enters a space 131a formed between the recess 131 and the lower die 82 at a relatively earlier stage. The resin that has been filled in the space 131a with a high pressure has no room to go further, and begins hardening. As a result, the die pad 101 and the lower die 82 are fixed firmly to each other. As described above, since the die pad 101 is fixed to the lower die 82 at the relatively earlier stage before the resin is filled completely in the dies, the subsequent resin injection does not cause the displacement or deformation of the die pad 101. Thus, it is possible to prevent the die pad 101 from floating up during the resin-sealing, so a resin layer cannot be formed easily on the lower surface 101b of the die pad 101, and the lower surface 101b of the die pad 101 can be arranged close to a resin surface of the semiconductor device, preferably exposed to the lower surface of the semiconductor device. Also, since the resin injection does not cause the distortion of the semiconductor chip 50 that is mounted on the die pad 101, it is possible to obtain the semiconductor device with a stable quality.

In the above description, the recess 131 can be formed, for example, by coining. The sunken amount $H_2$ of the recess 131 that is formed by this method with respect to the surface 101b (the protruding amount of the surface 101b with respect to the recess 131) normally is about 3 to 10 μm.

Figure 9A:
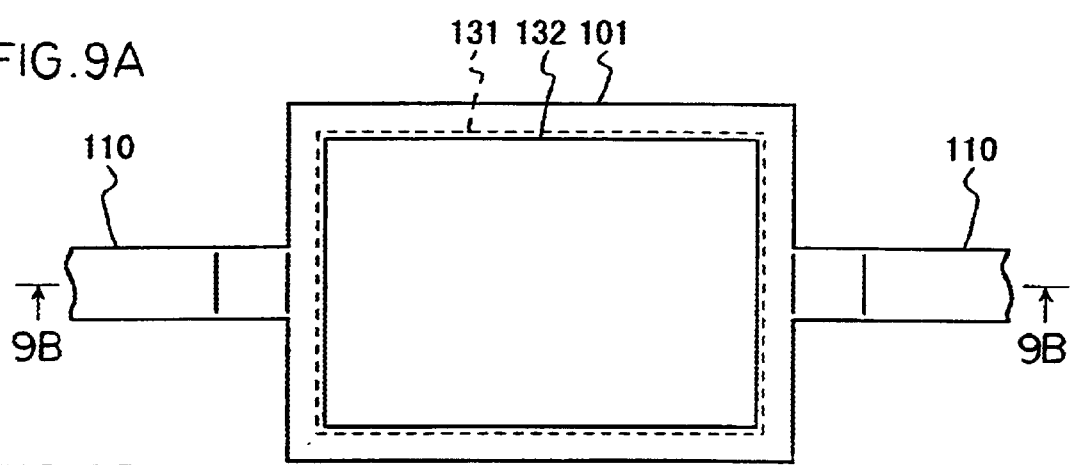
FIG. 9A is a plan view illustrating a shape of another lead frame used in the semiconductor device of the fourth embodiment of the present invention.
Figure 9B:
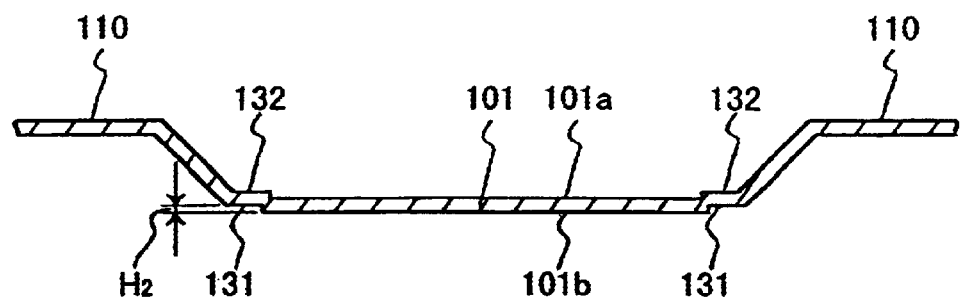
FIG. 9B is a sectional view taken along the line A—A in FIG. 9A.

FIG. 9A is a plan view illustrating another example of the shape of the lead frame used in the semiconductor device of the present embodiment. In FIG. 9A, numeral 101 denotes a die pad on which a semiconductor chip is mounted, and numeral 110 denotes a pair of support leads for supporting the die pad 101 from both sides. In order to simplify the drawing, the frame and bonding leads are omitted here. FIG. 9B is a sectional view taken along the line A—A in FIG. 9A seen in an arrow direction.

FIGS. 9A and 9B are different from FIGS. 8A to 8C in the method for forming a recess 131. In FIGS. 9A and 9B, the recess 131 is formed by exerting a shearing stress on the die pad 101 in such a manner as not to break it. Thus, on the periphery of the die pad 101 on the side of a surface 101a on which the semiconductor chip is mounted, a stepwise protrusion 132 protruding with respect to the surface 101a is formed. The sunken amount $H_2$ of the recess 131 that is formed by this method with respect to a surface 101b (the protruding amount of the surface 101b with respect to the recess 131) can be made larger than that in the case of FIGS. 8A to 8C and normally is about 30 to 60 μm.

The case of FIGS. 9A and 9B also can achieve the effect similar to that described in FIGS. 8A to 8C.

Fifth Embodiment

A semiconductor device of a fifth embodiment of the present invention will be described, with reference to the accompanying drawings.

Figure 10A:
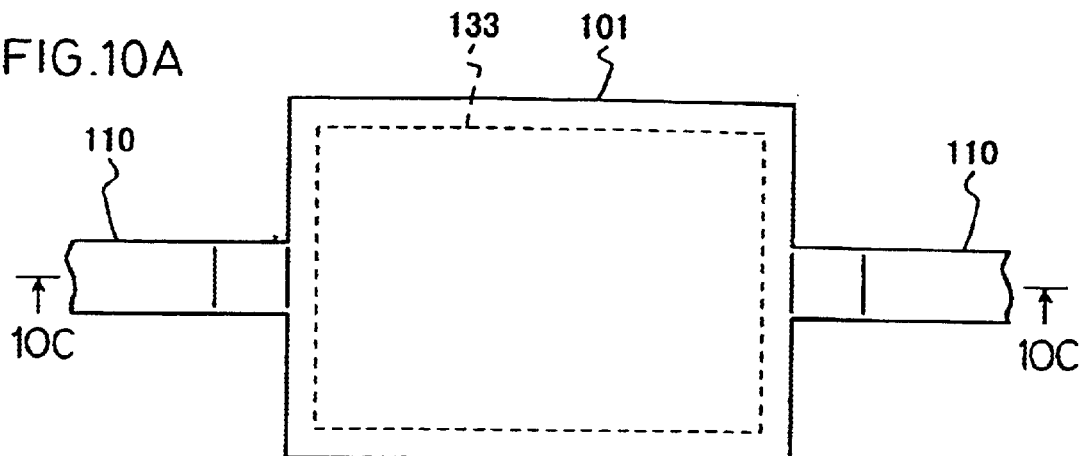
FIG. 10A is a plan view illustrating a shape of a lead frame used in a semiconductor device of a fifth embodiment of the present invention.
Figure 10B:
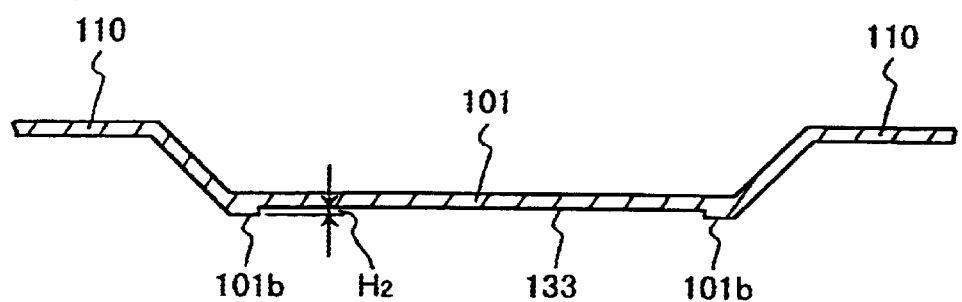
FIG. 10B is a sectional view taken along the line A—A in FIG. 10A.

FIG. 10A is a plan view illustrating a shape of a lead frame used in the semiconductor device of the present embodiment. In FIG. 10A, numeral 101 denotes a die pad on which a semiconductor chip is mounted, and numeral 110 denotes a pair of support leads for supporting the die pad 101 from both sides. The surface of the die pad 101 on which the chip is mounted is depressed with respect to the support leads 110. In order to simplify the drawing, a frame and bonding leads are omitted here. In addition, FIG. 10B is a sectional view taken along the line A—A in FIG. 10A seen in an arrow direction.

In the semiconductor device of the present embodiment, in the center of a surface 101b that is opposite to the surface of the die pad 101 on which the semiconductor chip is mounted, a recess 133 is formed that is sunken with respect to the surface 101b. In other words, the periphery 101b of the lower surface is formed so as to protrude stepwise.

Figure 10C:
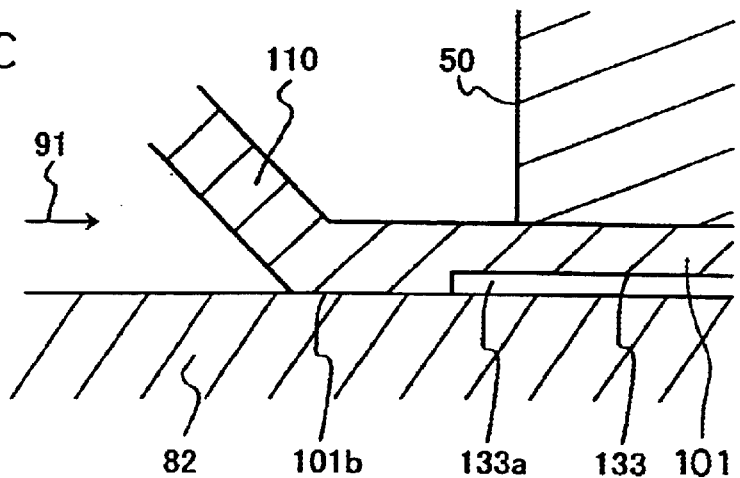
FIG. 10C is a partial enlarged sectional view illustrating a state of sealing with dies.

FIG. 10C is an enlarged sectional view illustrating a portion of the surface 101b and the recess 133 taken along a line corresponding to the line A—A in FIG. 10A when the semiconductor chip 50 is mounted on the die pad 101, followed by sealing with dies. As shown in the figure, the die pad 101 is sealed in the dies so that its protruding surface 101b contacts the wall surface of the lower die 82. Numeral 91 indicates an injection direction of a sealing resin.

In the present embodiment, when the sealing resin begins to be injected, the resin on the side of the lower surface of the support lead 110 displaces the die pad 101 slightly upward at a relatively earlier stage, so as to enter a slight clearance formed between the lower surface 101b of the die pad 101 and the lower die 82. The resin advances due to a high sealing pressure. When the sealing resin reaches a space 133a formed between the recess 133 and the lower die 82, the pressure to be put on the sealing resin drops sharply. This sharp drop of the resin pressure causes the die pad 101 to adhere to the lower die 82. As a result, it is possible to prevent the die pad 101 from floating up or being deformed during the resin-sealing. Thus, since the resin injection does not cause the distortion of the semiconductor chip 50 that is mounted on the die pad 101, it is possible to obtain the semiconductor device with a stable quality.

The recess 133 shown in FIGS. 10A to 10C is formed by coining. The sunken amount $H_2$ of the recess 133 that is formed by this method with respect to the surface 101b (the protruding amount of the surface 101b with respect to the recess 133) normally is about 3 to 10 μm.

In addition, the method for forming the recess 133 is not limited to coining. The recess 133 may be formed, for example, by exerting a shearing stress as in the recess 131 shown in FIGS. 9A and 9B.

Sixth Embodiment

A method for manufacturing a semiconductor device of a sixth embodiment of the present invention will be described, with reference to the accompanying drawings.

Figure 11A:
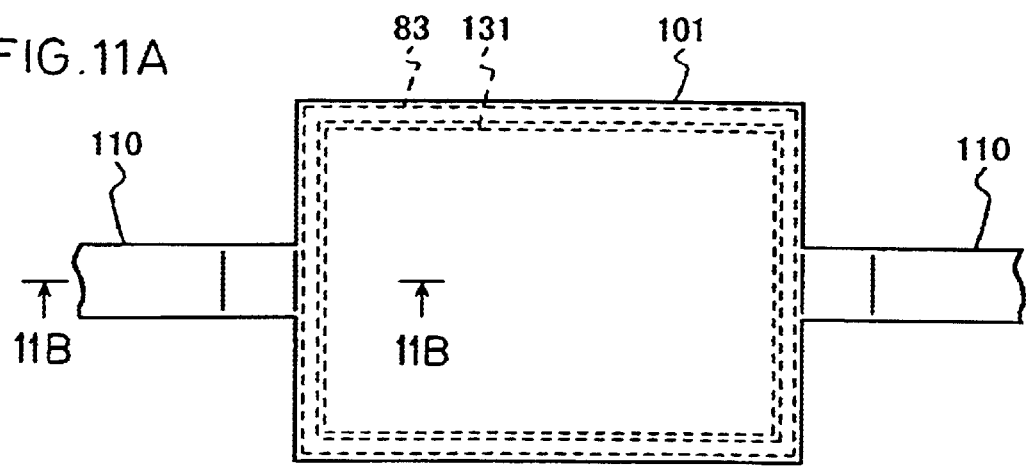
FIG. 11A is a conceptual plan view illustrating a state when a lead frame used in a semiconductor device of a sixth embodiment of the present invention is installed in dies for resin-sealing.
Figure 11B:
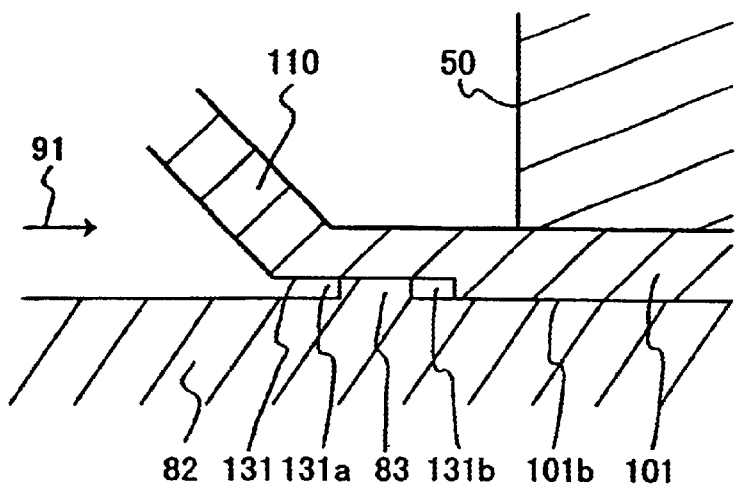
FIG. 11B is a sectional view taken along the line A—A in FIG. 11A.

FIG. 11A is a plan view illustrating a state conceptually when a lead frame used in the semiconductor device of the present embodiment is installed in dies for resin-sealing. In FIG. 11A, numeral 101 denotes a die pad on which a semiconductor chip is mounted, and numeral 110 denotes a pair of support leads for supporting the die pad 101 from both sides. The surface of the die pad 101 on which the chip is mounted is depressed with respect to the support leads 110. In order to simplify the drawing, the relationship between the die pad 101 and the lower die 82 alone is illustrated, and the semiconductor chip, the frame and bonding leads are omitted here. In addition, FIG. 11B is a sectional view taken along the line A—A in FIG. 11A seen in an arrow direction. Numeral 91 indicates an injection direction of a sealing resin.

On the periphery of the lower surface of the die pad 101 of the present embodiment, a recess 131 that is sunken stepwise with respect to the lower surface 101b is formed continuously as shown in FIGS. 8A to 8C. Also, in a position corresponding to the recess 131 in the lower die 82, a protrusion 83 is formed so as to have a substantially rectangular shape when seen from above. The recess 131 is wider than the protrusion 83, and the protrusion 83 is formed substantially in the center in a width direction of the recess 131. Thus, a space 131a is formed between the recess 131 and the lower die 82 on the outer side of the protrusion 83, while a space 131b is formed between the recess 131 and the lower die 82 on the inner side of the protrusion 83. The protruding height of the protrusion 83 from a base level of the lower die 82 is substantially the same as the sunken amount of the recess 131 from the lower surface 101b of the die pad 101.

In the present embodiment, since the recess 131 is formed on the periphery of the lower surface of the die pad 101, when the sealing resin begins to be injected, the resin on the side of the lower surface of the support lead 110 enters the space 131a formed between the recess 131 and the lower die 82 at a relatively earlier stage. A part of the resin that has been filled in the space 131a with a high pressure has no room to go, and begins hardening. On the other hand, the rest of the resin displaces the die pad 101 slightly upward, so as to enter a slight clearance formed between the lower surface of the recess 131 and the upper surface of the protrusion 83. Then, the resin advances due to a high sealing pressure. When the sealing resin reaches the space 131b, the pressure to be put on the sealing resin drops sharply. This sharp drop of the resin pressure causes the die pad 101 to adhere to the lower die 82. As described above, in the present embodiment, the space 131a functions in a similar manner to the space 131a of the fourth embodiment, while the space 131b functions in a similar manner to the space 133a of the fifth embodiment. A synergistic effect of these spaces 131a and 131b can prevent the displacement and deformation of the die pad 101. Thus, a resin layer cannot be formed easily on the lower surface 101b of the die pad 101, so that the lower surface 101b of the die pad 101 can be arranged close to a resin surface of the semiconductor device, preferably exposed to the lower surface of the semiconductor device. Also, since the resin injection does not cause the distortion of the semiconductor chip 50 that is mounted on the die pad 101, it is possible to obtain the semiconductor device with a stable quality.

Figure 12A:
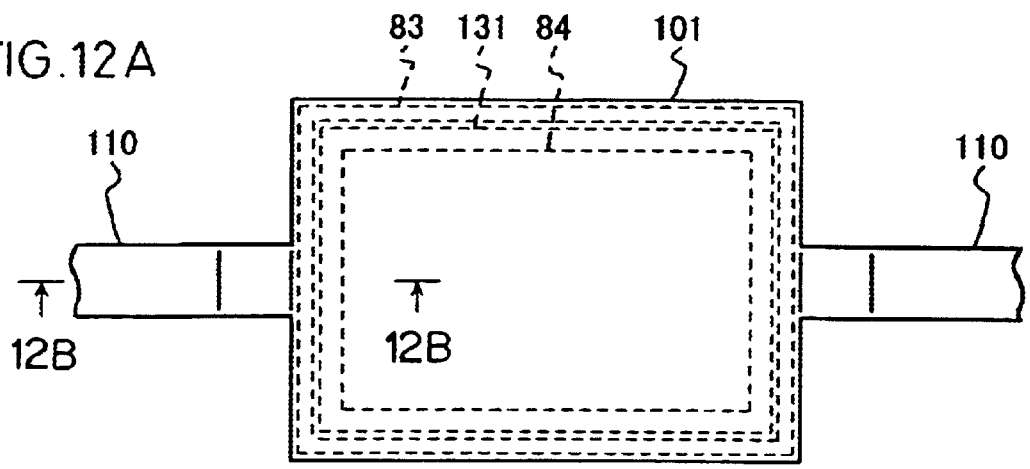
FIG. 12A is a conceptual plan view illustrating a state when another lead frame used in the semiconductor device of the sixth embodiment of the present invention is installed in the dies for resin-sealing.
Figure 12B:
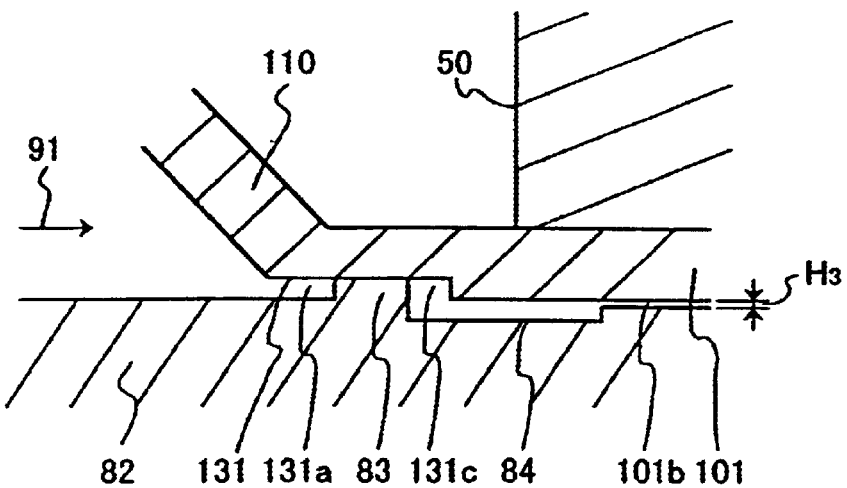
FIG. 12B is a sectional view taken along the line A—A in FIG. 12A.

FIG. 12A is a plan view illustrating a state conceptually when a lead frame used in the semiconductor device in another structural example of the present embodiment is installed in dies for resin-sealing. In FIG. 12A, numeral 101 denotes a die pad on which a semiconductor chip is mounted, and numeral 110 denotes a pair of support leads for supporting the die pad 101 from both sides. In order to simplify the drawing, the relationship between the die pad 101 and a lower die 82 alone is illustrated, and the semiconductor chip, the frame and bonding leads are omitted here. FIG. 12B is a sectional view taken along the line A—A in FIG. 12A seen in an arrow direction. Numeral 91 indicates an injection direction of a sealing resin.

In FIGS. 12A and 12B, on the inner side of a protrusion 83 of the lower die 82, a groove 84 is formed next to the protrusion 83 so as to have a substantially rectangular shape when seen from above. Accordingly, a space 131c formed between the recess 131 and the groove 84 on the inner side of the protrusion 83 is larger than the space 131b in FIGS. 11A and 11B. Thus, there is a larger amount of pressure drop when the sealing resin reaches the space 131c, and such phenomenon lasts longer than that in the case of FIGS. 11A and 11B.

In FIGS. 12A and 12B, the sunken amount of the recess 131 from the lower surface 101b of the die pad 101 need not be the same as, but may be smaller than the protruding height of the protrusion 83 from a surface facing the surface 101b of the lower die 82. In other words, as shown in FIG. 12B, a space having a thickness $H_3$ may be formed between the lower surface 101b of the die pad 101 and the lower die 82 when the protrusion 83 contacts the recess 131. As described above, a sticking effect of the die pad 101 to the lower die 82 is larger in the case of FIGS. 12A and 12B than that of FIGS. 11A and 11B, so that the gap $H_3$ between two surfaces becomes substantially zero during the resin-sealing. Therefore, in the case of FIGS. 12A and 12B, even when the sunken amount of the recess 131 from the lower surface 101b of the die pad 101 is not equivalent to the protruding height of the protrusion 83 from a surface facing the surface 101b of the lower die 82, the lower surface 101b of the die pad 101 can be arranged close to the resin surface of the semiconductor device, preferably exposed to the lower surface of the semiconductor device. Thus, it is possible to ease the machining accuracy of the protrusion 83 and the recess 131.

Seventh Embodiment

A method for manufacturing a semiconductor device of a seventh embodiment of the present invention will be described, with reference to the accompanying drawings.

Figure 13:
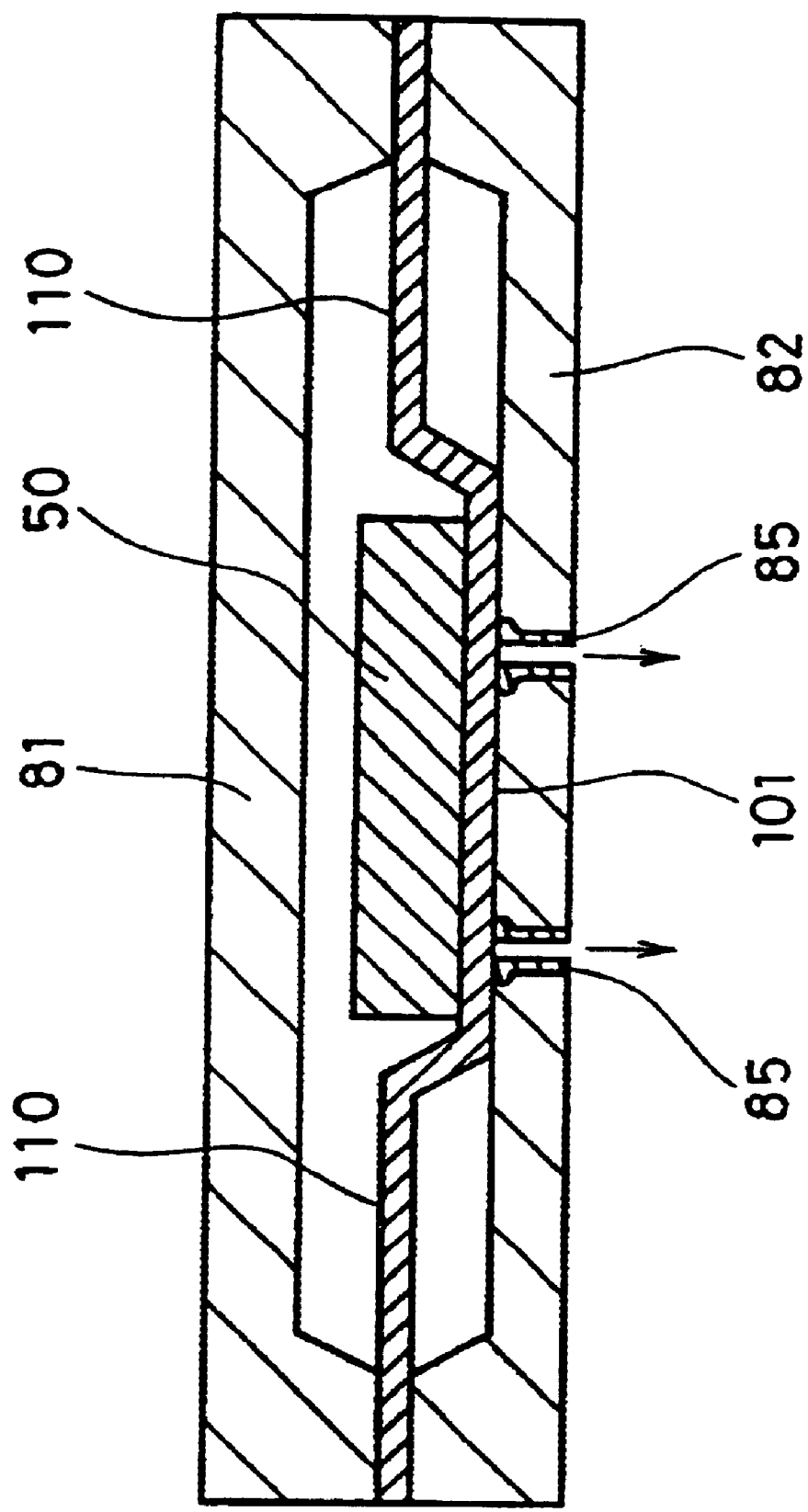
FIG. 13 is a sectional view illustrating a state when a lead frame of a seventh embodiment of the present invention is sealed in dies for resin-sealing.
Figures 16A, 16B:
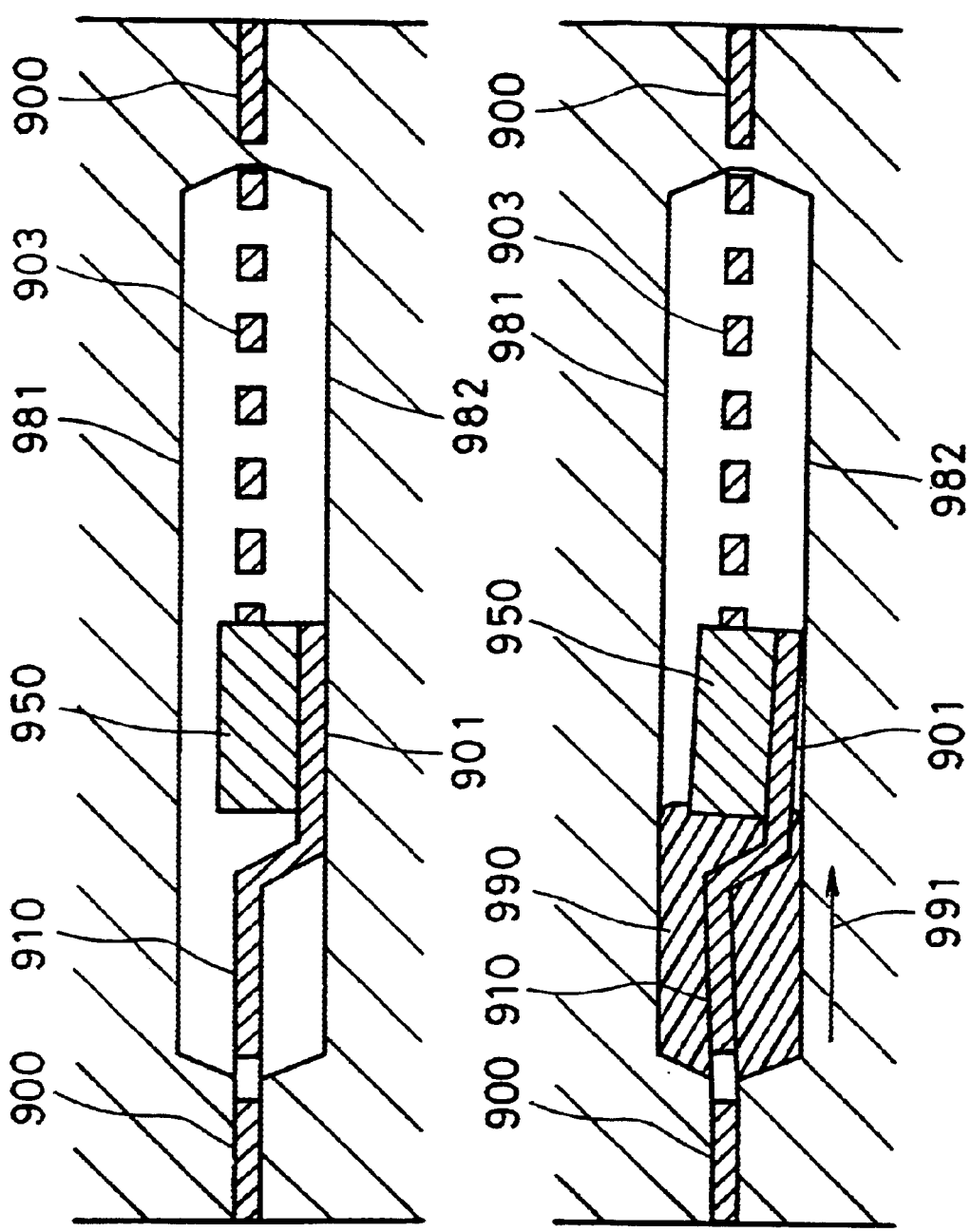
FIGS. 16A and 16B show combinational cross-sections illustrating manufacturing steps of the conventional semiconductor device.

FIG. 13 is a sectional view illustrating a state in the present embodiment when a lead frame is sealed in dies for resin-sealing. In FIG. 13, numeral 50 denotes a semiconductor chip, numerals 81 and 82 denote an upper die and a lower die respectively, numeral 101 denotes a die pad, and numeral 110 denotes support leads. The surface of the die pad 101 on which the chip is mounted is depressed with respect to the support leads 110.

In the present embodiment, suction holes 85 are provided in a contact region of the lower die 82 that the lower surface of the die pad 101 contacts, so that the die pad 101 is vacuum-drawn so as to be fixed firmly to the lower die 82. The injection of a sealing resin in this state makes it possible to prevent the die pad 101 from floating up or being deformed. Thus, the lower surface of the die pad 101 can be arranged close to a resin surface of the semiconductor device, preferably exposed to the lower surface of the semiconductor device. Also, since the resin injection does not cause the distortion of the semiconductor chip 50 that is mounted on the die pad 101, it is possible to obtain the semiconductor device with a stable quality.

It is preferable that material having excellent adherence and heat resistance such as silicon rubber is used in a portion of the suction hole 85 that contacts the die pad 101.

In addition, the position and number of the suction holes 85 can be determined by considering the size of the die pad 101 and the necessary sucking ability, etc.

In the semiconductor device and the method for manufacturing the same of the present invention, the first to seventh embodiments described above may be carried out individually or in combination in a suitable manner.

As described above, in accordance with the present invention, it is possible to prevent the displacement of the die pad during the resin-sealing and the residual distortion in the semiconductor chip, thereby providing the semiconductor device with a stable quality.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor device comprising:

a semiconductor chip;

a die pad having a surface on which the semiconductor chip is mounted;

support leads formed in one piece with the die pad;

bonding leads provided in a periphery of the die pad; and wires for connecting bonding pads of the semiconductor chip with the bonding leads, wherein the semiconductor chip, the die pad, the wires, and the support leads are sealed with a resin, protrusions are formed on the support leads on a same side as that of the die pad on which the semiconductor chip is mounted, and a distance between the surface of the die pad on which the semiconductor chip is mounted and tops of the protrusions is greater than a distance between the surface of the die pad on which the semiconductor chip is mounted and surfaces of the support leads on the same side as that of the die pad on which the semiconductor chip is mounted.

2. The semiconductor device according to claim 1, wherein a second protrusion is formed on a surface of the die pad opposite to that on which the semiconductor chip is mounted.

3. The semiconductor device according to claim 1, wherein tops of the protrusions are formed close to a resin surface of the semiconductor device.

4. The semiconductor device according to claim 2, wherein a top of the second protrusion is formed close to a resin surface of the semiconductor device.

5. The semiconductor device according to claim 1, wherein a surface of the die pad opposite to that on which the semiconductor chip is mounted is arranged close to a resin surface of the semiconductor device.

6. A semiconductor device comprising:
a semiconductor chip;
a die pad having a surface on which the semiconductor chip is mounted; and
support leads formed in one piece with the die pad;
wherein the semiconductor chip, the die pad, and the support leads are sealed with a resin, and
the support leads are curved so that each support lead has a cylindrical surface having a central axis parallel to a longitudinal direction of the support lead.

7. A semiconductor device comprising:
a semiconductor chip;
a die pad having a surface on which the semiconductor chip is mounted; and
support leads formed in one piece with the die pad, longitudinal directions of the support leads crossing a plane containing the die pad;
wherein the semiconductor chip, the die pad, and the support leads are sealed with a resin, and
a recess is formed on a periphery of a surface of the die pad opposite to the surface on which the semiconductor chip is mounted, and the surface opposite to that on which the semiconductor chip is mounted is arranged close to a resin surface of the semiconductor device.

8. The semiconductor device according to claim 1, wherein the die pad is displaced toward an opposite side of the surface on which the semiconductor chip is mounted with respect to the support leads.

9. The semiconductor device according to claim 1, wherein the protrusions are formed on portions of the support leads other than the bonding leads.

10. A semiconductor device comprising:
a semiconductor chip;
a die pad having a surface on which the semiconductor chip is mounted; and
support leads formed in one piece with the die pad;
wherein the semiconductor chip, the die pad, and the support leads are sealed with a resin, and
the support leads are bent at a predetermined angle in directions parallel to their longitudinal directions so that each support lead has a V-shaped cross section.

11. A semiconductor device comprising:
a semiconductor chip;
a die pad having a surface on which the semiconductor chip is mounted; and
support leads formed in one piece with the die pad;
wherein the semiconductor chip, the die pad, and the support leads are sealed with a resin,
a periphery of the die pad is formed to protrude on a side opposite to the surface on which the semiconductor chip is mounted,
a distance between a surface of the protruding periphery of the die pad that is opposite to the surface of the die pad on which the semiconductor chip is mounted, and the surface of the die pad on which the semiconductor chip is mounted, is equal to a thickness of a portion of the die pad other than the protruding periphery thereof, and
the protruding periphery is arranged in a vicinity of a resin surface of the semiconductor device.

12. The semiconductor device according to claim 1, wherein a protruding periphery is formed in an outermost periphery of a surface of the die pad that is opposite to the surface thereof on which the semiconductor chip is mounted.

13. The semiconductor device according to claim 12, wherein a distance between a surface of the protruding periphery of the die pad which is opposite to the surface of the die pad on which the semiconductor chip is mounted, and the surface of the die pad on which the semiconductor chip is mounted, is greater than a thickness of a portion of the die pad other than the protruding periphery, and
the protruding periphery is closer to the support leads than the portion of the die pad other than the protruding periphery.

* * * * *